United States Patent [19]

Yamamoto

[11] Patent Number: 4,868,838
[45] Date of Patent: Sep. 19, 1989

[54] SEMICONDUCTOR LASER DEVICE

[75] Inventor: Saburo Yamamoto, Nara, Japan

[73] Assignee: Sharp Kabushiki Kaisha, Osaka, Japan

[21] Appl. No.: 105,945

[22] Filed: Oct. 7, 1987

[30] Foreign Application Priority Data

| Jul. 10, 1986 | [JP] | Japan | 61-238235 |
| Aug. 10, 1986 | [JP] | Japan | 61-239470 |
| Aug. 10, 1986 | [JP] | Japan | 61-239471 |
| Aug. 10, 1986 | [JP] | Japan | 61-239472 |
| Aug. 10, 1986 | [JP] | Japan | 61-239473 |

[51] Int. Cl.$^4$ ............................................. H01S 3/19
[52] U.S. Cl. ...................................... 372/46; 372/45; 372/48
[58] Field of Search ................. 372/48, 46, 44, 45, 372/43

[56] References Cited

U.S. PATENT DOCUMENTS

| 4,366,569 | 2/1982 | Hirao et al. | 372/46 |
| 4,416,012 | 11/1983 | Botez et al. | 372/45 |
| 4,480,331 | 10/1984 | Thompson | 372/45 |
| 4,512,022 | 4/1985 | Tsang | 372/45 |
| 4,573,161 | 2/1986 | Sakai et al. | 372/45 |
| 4,631,802 | 12/1986 | Hayashi et al. | 372/45 |
| 4,635,268 | 1/1987 | Motegi et al. | 372/45 |
| 4,745,612 | 5/1988 | Hayakawa et al. | 372/45 |
| 4,750,183 | 6/1988 | Takahashi et al. | 372/45 |
| 4,757,510 | 7/1988 | Kaneno et al. | 372/45 |

FOREIGN PATENT DOCUMENTS

| 0026062 | 4/1981 | European Pat. Off. | 372/48 |
| 0044571 | 1/1982 | European Pat. Off. | |
| 0087253 | 2/1983 | European Pat. Off. | |
| 0125738 | 11/1984 | European Pat. Off. | |
| 0209372 | 7/1986 | European Pat. Off. | |
| 0206496 | 12/1986 | European Pat. Off. | |
| 0210616 | 2/1987 | European Pat. Off. | |
| 0215298 | 3/1987 | European Pat. Off. | |
| 1378128 | 12/1974 | United Kingdom. | |
| 2100501A | 12/1982 | United Kingdom. | |

OTHER PUBLICATIONS

Japanese Patent Publication 59-48976 (3/84), Furuse, "Semiconductor Laser".
Japanese Patent Publication 61-207090 (9/86), Kondo, "Semiconductor Light Emitting Device".
Smith, Jul./Aug. 1986, Xerox Disclosure Journal 11(4):151-152 "A Method For Fabricating An Index Guided Laser".
Hayakawa et al. (1986) Applied Physics Letters 49(11);636-638 "Low Current Threshold AlGaAs Visible Laser Diode with an $(AlGaAs)_m$ $(GaAs)_n$ Superlattice Quantum Well".
Patent Abstracts of Japan (Nov. 29, 1985) 9(302), E-362,2025 appl. No. 58-250138, "Buried Type Semiconductor Laser".

(List continued on next page.)

Primary Examiner—William L. Sikes
Assistant Examiner—Georgia Y. Epps
Attorney, Agent, or Firm—Irell & Manella

[57] ABSTRACT

A semiconductor laser device with a stripe-channeled substrate and an active layer for laser oscillation disposed over the substrate comprising an optical waveguide; a striped mesa that is formed by the removal of the portions corresponding to the outside of said optical waveguide; and a multi-layered crystal that is grown into said removed portions, said multi-layered crystal including a plurality of burying layers and containing a $pin^-$, $pp^-n^-$ or $pn^-n^-$ reverse bias junction, and a method for the production thereof comprising epitaxially growing a multi-layered crystal containing the active layer on a grown crystal that includes the stripe-channeled substrate; forming a striped mesa on the portion corresponding to said striped channel by the removal of the portions at both sides of said striped channel; and epitaxially growing a multi-layered crystal outside of said striped mesa, said multi-layered crystal including a plurality of burying layers and containing a $pin^-$, $pp^-n^-$ reverse bias junction.

8 Claims, 6 Drawing Sheets

OTHER PUBLICATIONS

Patent Abstracts of Japan (Jun. 28, 1984) 8(139), E-253, 1576, appl. No. 57-160054, "Semiconductor Laser".

Patent Abstracts of Japan (Nov. 22, 1984) 8(256), E-280, 1693, appl. No. 59-127893, "Semiconductor Laser".

Kurobe et al., (1986) Electronics Letters 22(21):1117–1118, "Submilliampere Lasing of Zn-Diffused Mesa Buried-Hetero $Al_xGa_{1-x}As$/GaAs Multi-Quantum-Well Lasers at 77K".

Patent Abstracts of Japan, vol. 5, No. 167 (E-79)[839], Oct. 24, 1981.

Patent Abstracts of Japan, vol. 9, No. 189 (E-333)[1912], Aug. 6, 1985.

Patent Abstracts of Japan, vol. 10, No. 244 (E-430)[2300], Aug. 22, 1986.

Patent Abstracts of Japan, vol. 7, No. 148 (E-184) [1293], Jun. 29, 1983.

SEMICONDUCTOR LASER DEVICE

BACKGROUND OF THE INVENTION

1. Field of the invention:

This invention relates to a semiconductor laser device which attains laser oscillation at an extremely low threshold current level.

2. Description of the prior art:

Conventional semiconductor laser devices are classified into two groups, gain-guided semiconductor laser devices and index guided semiconductor laser devices, according to their optical waveguiding mechanism. Index guided semiconductor laser devices are superior to gain-guided semiconductor laser devices in view of transverse mode stabilization which is important in practical use. Index guided semiconductor laser devices having a variety of structures have been proposed, typical examples of which are BH (buried heterostructure) lasers and VSIS (V-channeled substrate inner stripe) lasers.

FIG. 7 shows a conventional BH laser device, in which a double-heterostructure with a laser-oscillating active layer 3 sandwiched between the cladding layers 2 and 4 is formed into a mesa on a substrate 1 and a burying layer 14 having a low refractive index is buried outside of the mesa. The reference numeral 5 is a cap layer 5. The BH laser device oscillates a laser beam according to an index waveguiding operation and has a low threshold current of 10 mA or less. However, if a proper refractive index is not applied to the burying layer 14 and if a proper width w is not applied to the waveguide, the device will oscillate in a high-order transverse mode. Thus, the BH laser device is disadvantageous in that it is restricted by production conditions. Moreover, in order for the BH laser device to oscillate in a fundamental transverse mode, the width of the waveguide must be set to the 2 $\mu$m or less, which causes breakdown of the facets at a relatively low output power level, so that mass-production of the device cannot be attained and reliability of the device is decreased.

FIG. 8 shows a conventional VSIS laser device, which is produced as follows: On a substrate 1, a current blocking layer 6 is formed. Then, a striped V-channel having the width w is formed in the substrate 1 through the current blocking layer 6, resulting in a current path. Then, on the current blocking layer 6 including the V-channel, a cladding layer 2, a flat active layer 3 and a cladding layer 4 are successively formed, resulting in a double-heterostructure multi-layered crystal for laser oscillation operation. Even when the width w of the waveguide is set at a value of as large as 4-7 $\mu$m, since a laser beam outside of the waveguide within the active layer 3 is absorbed by the substrate 1, high-order mode gain is suppressed and a high-order transverse mode does not occur. However, the threshold current of this VSIS laser device is 40-60 mA, which is extremely higher than that of the BH laser device. This is because current injected into the device is confined within the inner striped structure formed by the current blocking layer 6, but carrier injected into the active layer 3 diffuses into the outside of the active layer 3, resulting in carrier unusable for laser oscillation. FIG. 9 shows the distribution of carrier density in the junction direction y within the active layer of the VSIS laser device, indicating that when the waveguide width w is 4 $\mu$m, carrier in the shaded areas (corresponding to the outside of the waveguide) is unusable for laser oscillation. The unusable carrier results in unnecessary light and/or generates unnecessary heat, causing an increase in the threshold current of the device and a decrease in reliability of the device.

In order to solve the problems of both the BH laser device and the VSIS laser device, as shown in FIG. 10, a method by which grooves are formed on both sides of the V-channel of the VSIS laser device from the cap layer 5 to the current blocking layer 6 by an etching technique, and subsequently filled with a burying layer having a greater energy gap than the active layer has been proposed by, for example, Japanese patent application No. 60-78004. The device with such a structure is hereinafter referred to as a BH-VSIS laser device, in which the diffusion of carrier in the transverse direction within the active layer is prevented by the burying layer and moreover a laser beam produced in the active layer is absorbed by the area outside of the striped channel of the substrate, resulting in a decrease in the effective refractive index, so that the portion of the active layer corresponding to the channel forms an optical waveguide, which causes the suppression of the occurrence of a high-order mode. However, in the conventional BH-VSIS laser device, leakage current I1 flows from the mesa to the burying area outside of the mesa as shown in FIG. 5, resulting in a limitation of the decrease in the threshold current. Output power at which the facets of the BH-VSIS laser device is broken down is 20-30 mW. This is the same as that of the VSIS laser device. In addition, three crystal growth processes are required for the production of the BH-VSIS laser device because of the growth of each of the current blocking layer 6, a double-heterostructure multi-layered crystal disposed on the current blocking layer and the burying layer buried outside of the mesa. A decrease in the number of crystal growth processes is desirable in view of the reproducibility and/or the mass production of the laser device.

SUMMARY OF THE INVENTION

The semiconductor laser device of this invention, which overcomes the above-discussed and numerous other disadvantages and deficiencies of the prior art, comprises an optical waveguide that is formed within the active layer based on a decrease in the effective refractive index due to the striped channel of the substrate, the outside of which absorbs a laser beam produced in the active layer, a striped mesa that is formed by the removal of the portions corresponding to the outside of said optical waveguide, and a multi-layered crystal that is grown into said removed portions, said multi-layered crystal including a plurality of burying layers and containing a pin-, pp$^-$n-or pn$^-$n- reverse bias junction.

In a preferred embodiment, the multi-layered crystal is composed of a current blocking layer disposed on the substrate and a plurality of burying layers disposed on said current blocking layer, or composed of a plurality of burying layers disposed on the substrate.

In a preferred embodiment, the burying layer that comes into contact with the active layer on the side walls of said striped mesa has a high resistance of 0.1 $\Omega \cdot$cm or more. An undoped or Ge doped $Ga_{1-z}Al_zAs$ layer having an Al composition ratio z of 0.5-1 is used as said burying layer that comes into contact with the active layer on the side walls of said striped mesa.

In a preferred embodiment, all of the burying layers have a high resistance of 0.1 Ω·cm or more and constitute a pin-, pp⁻n- or pn⁻n- reverse bias junction.

In a preferred embodiment, the width of the active layer within the striped mesa is uniform from one facet to the other facet of said laser device, or greater than that of the striped channel in the vicinity of the facets of said laser device and is nearly equal to that of the striped channel inside of both facets of said laser device.

The method for the production of a semiconductor laser device of this invention comprises epitaxially growing a multi-layered crystal containing the active layer on a grown crystal that includes the stripe-channeled substrate forming a striped mesa on the portion corresponding to said striped channel by the removal of the portions at both sides of said striped channel and epitaxially growing a multi-layered crystal outside of said striped mesa, said multi-layered crystal including a plurality of burying layers and containing a pin-, pp⁻n- or pn⁻n- reverse bias junction.

In a preferred embodiment, the multi-layered crystal is composed of a current blocking layer disposed on the substrate and a plurality of burying layers disposed on said current blocking layer, or composed of a plurality of burying layers disposed on the substrate.

In a preferred embodiment, the end faces of the active layer on the side walls of the striped mesa that come into contact with a burying crystal layer-growth solution undergo meltback when said multi-layered burying crystal is grown outside of the striped mesa.

Thus, the invention described herein makes possible the objects of (1) providing a semiconductor laser device in which a burying layer that comes into contact with the active layer is made of a high-resistive substance, resulting in a decrease in leakage current from the mesa to the burying area outside of the mesa, thereby attaining an extremely low threshold current level; (2) providing a semiconductor laser device in which a high-order mode does not arise but a fundamental transverse mode arises even though the mesa width is as great as 4–8 μm; (3) providing a BH-VSIS semiconductor laser device which has window regions in the vicinity of the facets, thereby oscillating a laser beam at a low threshold current level and attaining high output power; (4) providing a semiconductor laser device in which even though the Al composition ratio of the cladding layers is 0.4 or more, the burying layers can be grown in a manner to completely bury the mesa, thereby attaining laser oscillation at a short wavelength; and (5) providing a semiconductor laser device in which a non-radiative recombination center is not formed at the end faces of the active layer on the side walls of the mesa, thereby attaining an enlargement of the life of the laser device.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

This invention provides a semiconductor laser device in which the area for the prevention of the diffusion of carrier in the transverse direction within the active layer is made of highly resistive substances; in which the area outside of the striped mesa is constituted by burying layers including pin-reverse bias junctions therebetween wherein the i-layer includes a $p^-$- or $n^-$- highly resistive layer, preferably, with a specific resistance of 0.1 Ω·cm or higher; and in which an undoped or a Ge doped $Ga_{1-z}Al_zAs$ ($0.5 < z < 1$) is employed for the said highly resistive substances. The resistance of the $Ga_{1-z}Al_zAs$ crystal becomes higher with an increase in the value z because the level of the remaining impurity or the Ge acceptor becomes greater.

EXAMPLE 1

Figure 1A:
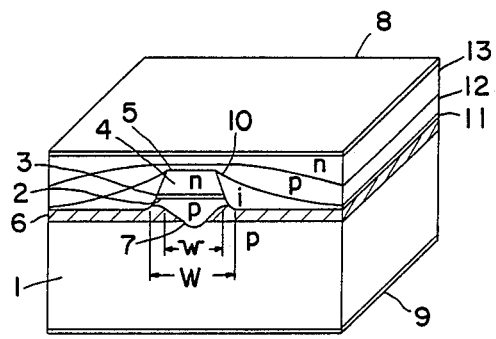
FIGS. 1(A) to 1(E), respectively, are perspective views showing examples of a semiconductor laser device of this invention.

FIG. 1(A) shows a semiconductor laser device of this invention, which is produced as follows: On a p-GaAs substrate 1, an n-GaAs current blocking layer 6 is formed by a crystal growth technique. Then, a V-striped channel 7 having a width w of 4 μm is formed in the substrate 1 through the current blocking layer 6 by photolithography and an etching technique. On the current blocking layer 6 including the V-channel 7, a p-GaAlAs cladding layer 2, an active layer 3, an n-GaAlAs cladding layer 4 and an n-GaAs cap layer 5 are successively formed. Then, the outside of the multi-layered crystal positioned over the V-channel 7 is removed by an etching technique from the cap layer 5 to the current blocking layer 6, resulting in a striped mesa 10 with a width W of 6 μm (wherein w < W). The width W is, in fact, the width of the active layer within the striped mesa 10. Then, an $i-Ga_{1-z}Al_zAs$ ($z=0.8$) first burying layer 11, a $p-Ga_{1-z}Al_zAs$ ($z=0.2$) second burying layer 12 and an n-GaAs third burying layer 13 are successively grown outside of the mesa 10 by liquid phase epitaxy. The growth period of the first and second burying layers 11 and 12 is limited to a certain value so that the burying layers 11 and 12 are not grown over the surface of the cap layer 5. The growth period of the third burying layer 13 is so long that the burying layer 13 is grown over the surface of the cap layer 5. There is no upper limitation to the thickness of the burying layer 13, and it should be set to be sufficiently thick. The top surface of the third burying layer 13 becomes flat, on which the n-sided electrode 8 is formed. The p-sided electrode 9 is formed on the back face of the substrate 1.

The resulting semiconductor laser device suppressed the occurrence of leakage current, resulting in a decrease in the threshold current level, about 10 mA (when the internal cavity length is 200 μm). The oscillation wavelength was 780 nm. This laser device also oscillated a laser beam in a stabilized fundamental transverse mode up to 30 mW optical output power at continuous oscillation operation. This laser device can be easily reproduced.

EXAMPLE 2

Figure 1B:
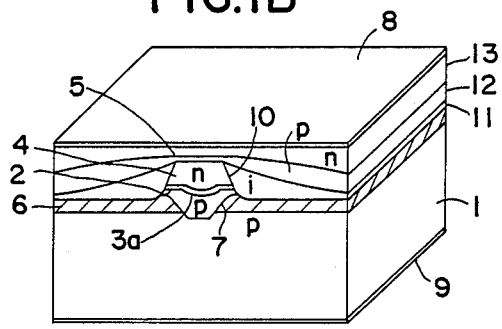

FIG. 1(B) shows another semiconductor laser device of this invention, which is the same as the laser device of Example 1 except that the active layer 3a for laser oscillation is formed into a curved shape. This device is advantageous in that the threshold current can be lowered, 20-30 mA, but it is disadvantageous in that it tends to oscillate a laser beam in a high-order transverse mode at a low output power (e.g., 5 mW). This is because carrier within the active layer 3a diffuses in the transverse direction with an increase in optical output power, resulting in a hole-burning effect which causes an indented carrier distribution in the oscillation area. The said carrier distribution meets the distribution of a first-order mode, and accordingly the suppression effect on a first-order mode based on the absorption of carrier by the substrate does not operate, which allows for the occurrence of the first-order mode. Thus, if the diffusion of carrier in the transverse direction within the active layer 3a is prevented, the hole-burning effect will not arise and the occurrence of a first-order mode will be suppressed. In fact, when burying layers 11, 12 and 13 are buried outside of the curved active layer 3a having a 830 nm band in the same procedures as those of Example 1, the resulting laser device oscillated a laser beam at a threshold current of as low as 7 mA. Moreover, oscillation in a stabilized fundamental transverse mode up to 15 mW optical output power was observed at continuous oscillation operation.

EXAMPLE 3

Figure 1C:
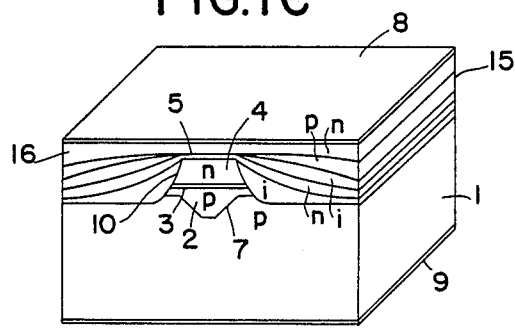

FIG. 1(C) shows another semiconductor laser device of this invention, which is different from the devices of Examples 1 and 2 in that there is no current blocking layer, and accordingly the number of crystal growth processes are reduced.

According to this example, the V-striped channel 7 is formed in the p-GaAs substrate 1, and then cladding layers 2 and 4 are formed on the substrate 1 so as to sandwich the active layer 3 therebetween, resulting in a double-heterostructure. Thereafter, the mesa 10, the width of which is greater than that of the V-channel 7, is formed, followed by formation of a burying layer 15 composed of i-, n-, i-, p-, and n-layer elements on both sides of the mesa 10. The first layer element of the burying layer 15 functions to decrease leakage current at the side faces of the mesa 10 and the second, third and fourth layer elements (i.e., the nip layer elements) constitute a reverse bias junction in the laser operation, thereby preventing the turn-on phenomenon. As the i-layer element, an undoped $Ga_{1-z}Al_zAs$ (z=0.8) crystal is employed. The first to fourth layer elements are not grown over the surface of the cap layer 5, but the fifth layer element (i.e., an n-GaAs layer) 16 is grown over the surface of the cap layer 5. This laser device oscillated laser beam of a wavelength of 830 nm at a threshold current of 12 mA.

EXAMPLE 4

Figure 1D:
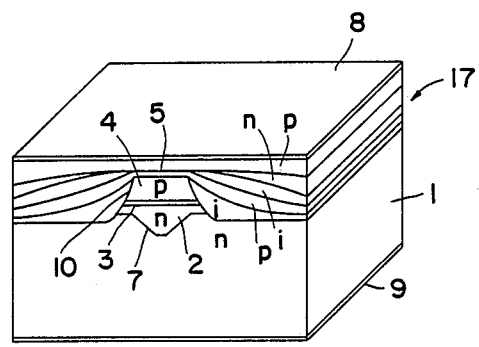
Figure 1E:
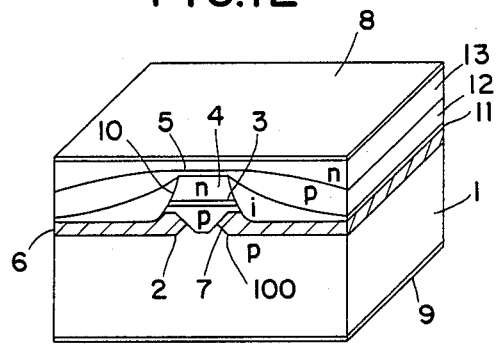

FIG. 1(D) shows another semiconductor laser device of this invention, which has the same structure as that of Example 3 except that the polarity of each of the layer elements of the burying layer 17 is different from that of each of the layer elements of the burying layer 16 shown in FIG. 1(C). This laser device is produced as follows: A V-striped channel 7 is formed on an n-GaAs substrate 1 and then cladding layers 2 and 4 are formed on the substrate 1 in a manner to sandwich the active layer 3 therebetween, resulting in a double-heterostructure multi-layered crystal. Thereafter, a mesa 10, the width of which is greater than that of the V-channel 7, is formed. The burying layer 17 composed of the five layer elements (i.e., the i-, p-, i-, n- and p- layers) is grown on both sides of the mesa 10. The resulting laser device oscillated laser beam of a wavelength of 830 nm at a threshold current of 12 mA.

EXAMPLE 5

The thickness of the double-heterostructure multi-layered crystal of a semiconductor laser device is not uniform over the whole area thereof, and accordingly, in the mesa-etching process of Example 1 shown in FIG. 1(A), the thickness of the n-GaAs current blocking layer 6 becomes so thin that, occasionally, the layer 6 cannot function to block current. This laser device has a current blocking layer 6, the portions of which correspond to the outside of the V-channel 7 are set to be thick enough to attain a complete blockage of current. In order to obtain such a thick current blocking layer, a striped mesa 100 having a width of 5 μm and a height of 0.5 μm is formed in a p-GaAs substrate 1, first, and then the current blocking layer 6 is grown on the substrate 1 including the striped mesa 100. Thereafter, the same procedures as in the above-mentioned examples are carried out. Since the resulting laser device has the above-mentioned structure, the reproducibility thereof can be improved.

According to Examples 1-5, the burying layer which comes into contact with the active layer is made of a highly resistive substance, so that leakage current flowing through the highly resistive burying layer can be minimized. Moreover, the p-n junction of the outside of the mesa is set to be a reverse bias polarity, so that the breakdown voltage thereof becomes high during laser operation, thereby preventing the turn-on phenomenon. Thus, the degree of freedom of production conditions (e.g., the thickness of the active layer, the width of the mesa, the junction position of the burying layers, etc.) of the laser device can be enlarged over that of the production conditions of conventional BH laser devices, and moreover, laser oscillation in a fundamental transverse mode can be attained. Moreover, the threshold current of the semiconductor laser devices of these examples is one half or less that of conventional VSIS laser devices, which is advantageous in practical use.

EXAMPLE 6

It was found by the inventor of this invention that the oscillation wavelength λ1, in the case where the mesa width W of a BH-VSIS laser device is set to be nearly equal to the V-channel width w (namely, W≃w), is larger by 20-30 nm than that in the case where the mesa width W is sufficiently greater than the V-channel width w or greater than that of an ordinary VSIS laser device (namely, W>>w). For example, when burying layers were buried on both sides of a mesa having a width W of 5.5 μm with regard to a 830 nm band VSIS laser device having a V-channel width w of 5 μm, the resulting laser device oscillated laser beam at an oscillation wavelength λ1 of 855 nm that is longer than that of the VSIS laser device without a mesa. This is because when W≃w, light produced within the active layer is not absorbed by the GaAs substrate due to the great coefficient Γ of light confinement in the junction direction, resulting in a small threshold value gain gth. When the value of gth is small, the amount of carrier to be accumulated into the active layer is reduced so that laser oscillation begins without an increase in the electron Fermi level (i.e., without the band-filling effect), resulting in a long oscillation wavelength. This example which utilizes the above-mentioned phenomenon provides a semiconductor laser device in which an area that does not absorb a laser beam is formed in the vicinity of each of the facets.

Figure 2A:
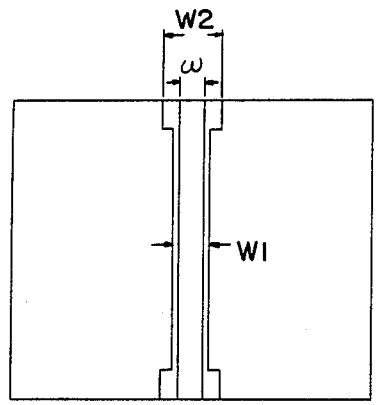
FIG. 2(A) is a diagram showing the window structure of another semiconductor laser device of this invention.
Figure 2B:
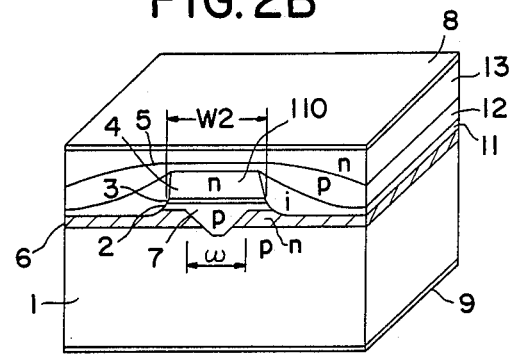
FIG. 2(B) is a perspective view showing the semiconductor laser device of FIG. 2(A).
Figure 2C:
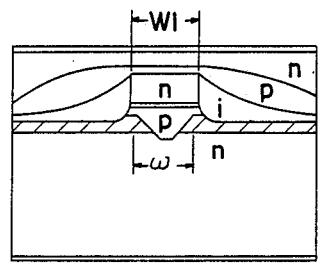
FIG. 2(C) is a cross-sectional view showing the semiconductor laser device of FIG. 2(A).

FIGS. 2(A) to 2(C) show a semiconductor laser device of this invention, in which the mesa width W is sufficiently greater than the V-channel width w in the vicinity of each of the facets (i.e., W>>w) and the mesa width W is nearly equal to the V-channel width w inside of both facets (i.e., W≃w). As mentioned above, the coefficient of light confinement Γ in the inside area positioned between the facets is greater than that of light confinement in the vicinity of the facets, and moreover, the diffusion of carrier within the active layer in the inside area positioned between the facets is smaller than that of carrier within the active layer in the vicinity of the facets, so that laser oscillation is attained with a long wavelength at a low threshold current level in the inside area positioned between the facets, whereas laser oscillation is attained at a high threshold current level in the vicinity of the facets. Thus, when voltage is applied to this laser device and current flows through this laser device, the said inside area begins oscillation, first, and carrier is accumulated in the portions of the active layer in the vicinity of the facets, resulting in an increase in the Fermi level in the vicinity of the facets, resulting in an area (i.e., a window region) in the vicinity of each of the facets, wherein laser beam with a wavelength produced within the active layer in the said inside area is not absorbed.

The above-mentioned laser device is produced as follows:

The width of the V-channel 7 of a VSIS laser device having a p-GaAs substrate 1 is set to be 5 μm, and then a double-heterostructure multi-layered crystal composed of a p-GaAs cladding layer 2, an active layer 3 and an n-GaAlAs cladding layer is grown on the n-GaAs current blocking layer 6 including the V-channel 7. Then, grooves are formed by an etching technique from the n-GaAs cap layer 5 to the n-GaAs current blocking layer 6, resulting in the mesa 110 with a width W1 of 5.5 μm in the inside area (the length of which is 200 μm) positioned between the facets and with a width W2 of 8 μm in the vicinity of the facets (i.e., in the window regions, each of which has a length of 25 μm from the corresponding facet). Thereafter, the grooves are filled with burying layers composed of an i-Ga$_{0.2}$Al$_{0.8}$As first burying layer 11, a p-Ga$_{0.8}$Al$_{0.2}$As second burying layer 12 and an n-GaAs third burying layer 13 in that order by liquid phase epitaxy. Since the growth period for both the first burying layer 11 and the second burying layer 12 is set to be short, neither layer is grown on the top surface of the cap layer 5. The growth period for the third burying layer 13 is set to be long enough that the third burying layer 13 can be grown over the top surface of the cap layer 5. The surface of the third burying layer 13 becomes flat. The semiconductor laser device of this example oscillated laser beam at a threshold current of around 20 mA which is about one half that of a conventional VSIS laser device. The oscillation wavelength of this semiconductor laser device was 850 nm, and the output power at which the facets are broken down was 70 mW in the continuous oscillation operation when the facets are not coated. The far-field pattern thereof exhibited a fundamental transverse mode oscillation behavior that is the same as that of a typical VSIS laser device, and moreover the fluctuation that tends to arise in laser oscillation of a conventional BH laser device was not observed in this semiconductor laser device.

The semiconductor laser devices of Examples 1 to 6 are not limited to the GaAs-GaAlAs systems, but they can be applied to laser devices with the InP-InGaAsP systems or other heterostructures. Moreover, the crystal growth technique is not limited to liquid phase epitaxy, but metal organic-chemical vapor deposition, vapor phase epitaxy, molecular beam epitaxy, etc., can be employed.

EXAMPLE 7

In order for a conventional GaAlAs/GaAs system) BH laser device to attain laser oscillation at a short wavelength, the Al composition ratio of the cladding layers must be great (0.4 or more), which causes difficulties in the epitaxial growth of the burying layers. This is because when the Al composition ratio of the cladding layers is 0.4 or more, the wetting of the side walls of the mesa by a Ga solution is reduced in the growth of the burying layers. Thus, it is difficult to produce a BH laser device oscillating a laser beam at a short wavelength. For the same reasons, it is also difficult to produce a BH-VSIS laser device oscillating a laser beam at a short wavelength.

Figure 4A:
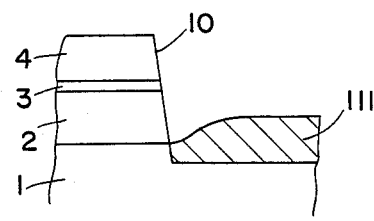
FIGS. 4(A) and 4(B) are diagrams illustrating the positioning relationship between the mesa and the burying layers.
Figure 4B:
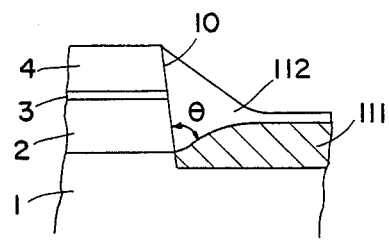

This example provides a semiconductor laser device in which a plurality of (i) highly resistive layers are buried outside of the mesa and in which the burying area is constituted by a multi-layered structure containing a pin-reverse bias junction. When a plurality of highly resistive layers are used for burying layers, as shown in FIG. 4(B), the angle θ of the second highly resistive burying layer 111 against the side wall of the mesa 10 is small enough to have the second highly resistive burying layer 112 grown at the said corner, so that the side walls of the mesa 10 including the end faces of the active layer 3 can be completely buried by the burying layers 111 and 112. On the other hand, when a single highly resistive layer is used as the burying layer as shown in FIG. 4(A), even though the growth period for the highly resistive burying layer 111 is set to be longer, the highly resistive burying layer 111 is not grown to bury the entire side walls of the mesa 10.

Figure 3:
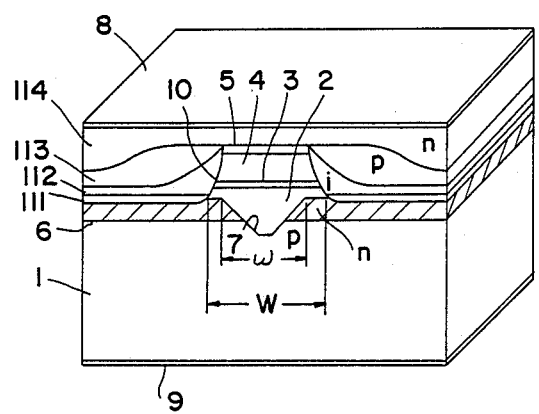
FIG. 3 is a perspective view showing another semiconductor laser device of this invention.

The semiconductor laser device of this example is shown in FIG. 3, which is produced as follows: On a p-GaAs substrate 1, an n-GaAs current blocking layer 6 is grown, followed by the formation of a V-striped channel 7 with a width w of 4.5 μm in the substrate through the current blocking layer 6. Then, on the current blocking layer 6 including the V-channel 7, a p-Ga$_{1-y}$Al$_y$As cladding layer (y=0.8) 2, a Ga$_{1-x}$Al$_x$As active layer (x=0.3) 3, an n-$Ga_{1-y}Al_yAs$ (y=0.8) 4, and an n-GaAs cap layer 5 are successively grown. Grooves are then formed by an etching technique from the cap layer 5 to the current blocking layer 6, resulting in a mesa 10 in which the width W of the active layer 3 is 6 μm. Thereafter, the grooves are filled with an i-$Ga_{1-z}Al_zAs$ layer (z=0.8) 111, an i-$Ga_{1-z}Al_zAs$ layer (z=0.8) 112, a p-GaAs layer 113, and an n-GaAs layer 114 in that order by liquid phase epitaxy. Since the Al composition ratio of the cladding layer 2 is as high as 0.8, the i-GaAs first layer 111 cannot be grown along the entire side walls of the mesa 10. The growth of the i-GaAlAs first layer 111 stops on or just before the side walls of the p-cladding layer 2. However, since the angle of the i-GaAlAs first layer 111 against the side walls of the mesa 10 is small enough to have the i-GaAlAs layer 112 grown at the said corner, so that the side walls of the mesa 10 can be completely buried by the first and second layers 111 and 112.

Then, the substrate 1 is subjected to an etching treatment to adjust the thickness of the wafer to about 100 μm. The upper face of the burying layer 114 and the back face of the substrate 1 are then subjected to a vapor deposition treatment with metal materials of Au-Ge-Ni and Au-Zn, respectively, and subjected to a heating treatment to form an n-sided electrode 8 of an alloy of Au-Ge-Ni and a p-sided electrode 9 of an alloy of Au-Zn, respectively, followed by cleaving and scribing to form a laser device unit having an internal cavity length of about 250 μm and a width of about 300 μm. The facets are coated with $Al_2O_3$. The unit is then mounted on a copper plate by means of a soldering material such as In in such a manner that the face of the n-sided electrode 8 faces the copper plate, resulting in a BH-VSIS semiconductor laser device unit of this invention.

The i-burying layers of the burying area that are composed of a pnipn structure of this BH-VSIS laser device function to prevent the flow of current therethrough. This is because when this laser device is forwardly biased, the nip junction works as a reverse bias and its breakdown voltage becomes high due to the said i layers. Moreover, leakage current that flows from the side walls of the mesa to the burying layers can be minimized because the burying layers are made of highly resistive substances.

The oscillation wavelength of this BH-VSIS laser device was as short as 700 nm and the threshold current thereof was as small as about 30 mA, which corresponds to a threshold current density of 2 $KA/cm^2$.

The threshold current of another BH-VSIS laser device oscillating a laser beam at a wavelength of 750 nm, which was produced in the same process as that of this example, was 20 mA.

As mentioned above, the BH-VSIS laser device of this example can attain laser oscillation at a short wavelength at a low threshold current level. The semiconductor laser device of this example is not limited to the above-mentioned BH-VSIS laser device, but it is, of course, applicable to an ordinary BH laser device. Moreover, it is not limited to the GaAlAs system laser device, but it is applicable to InGaAsP system or InGaAlP system laser devices. The crystal growth technique is not limited to liquid phase epitaxy, but it is applicable to metal-organic chemical vapor deposition, vapor phase epitaxy, molecular beam epitaxy, etc.

EXAMPLE 8

This example provides a method for the production of a BH-VSIS laser device having no n-GaAs current blocking layer. According to this method, when the substrate is of a p-type, an nipn-junction is constructed in the laser device and when the substrate is of an n-type, a pinp-junction is constructed in the laser device. The nip- or pin- reverse bias junction functions to prevent the flow of current from the mesa to the burying area.

Figure 5:
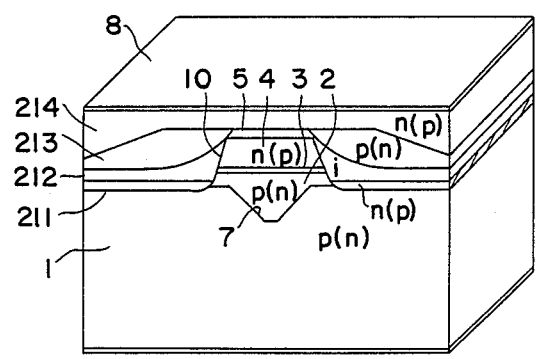
FIG. 5 is a perspective view showing another semiconductor laser device of this invention.

FIG. 5 shows a BH-VSIS semiconductor laser device of this example, which is produced as follows: On a p-GaAs substrate 1, a V-striped channel 7 is formed. Then, on the substrate 1, a p-GaAlAs cladding layer 2, a p- or n-GaAlAs (GaAs) active layer 3, an n-GaAlAs cladding layer 4 and an $n^+$-GaAs cap layer 5 are successively grown by liquid phase epitaxy, resulting in a multi-layered crystal structure for laser oscillation. The above-mentioned process is the first crystal growth process. Then, grooves are formed by an etching technique from the cap layer 5 to the substrate 1, resulting in a mesa 10 positioned over the V-channel 7. Then, the second crystal growth process for the formation of burying layers in the grooves using liquid phase epitaxy is carried out as follows: A first burying layer 211 having a polarity different from that of the substrate 1 is grown on the substrate 1, but it is not grown beyond the active layer 3. Such regulation of the growth of the first layer 211 can be achieved by decreasing the degree of supersaturation of the crystal growth solution. Then, a second burying layer 212 (i.e., an i- highly resistive layer) is grown by the use of an undoped GaAlAs crystal having a sufficiently high Al composition ratio, followed by growing a third burying layer 213 having the same polarity as that of the substrate 1 and a fourth burying layer 214 having a polarity different from that of the substrate 1 in that order. The growth period for the first, second and third burying layers 211, 212 and 213 is short so that they cannot be grown over the cap layer 5. The growth period for the fourth burying layer 214 is long enough to grow over the cap layer 5. The top surface of the fourth burying layer 214 is flat. The first burying layer 211 is preferably made of a GaAlAs crystal, which does not absorb laser beams, so that the turn-on phenomenon can be suppressed in the pnipn (or npinp) structure. The third burying layer 213 can be made of a GaAs or GaAlAs crystal. The fourth burying layer 214 is preferably made of a GaAs crystal, resulting in reduced ohmic resistance.

The resulting BH-VSIS laser device oscillated a laser beam of a wavelength of 830 nm at a threshold current of 20 mA, which is the same as the threshold current value of a BH-VSIS laser device having a current blocking layer.

The semiconductor laser device of this example is not limited to the above-mentioned BH-VSIS laser device, but it is, of course, applicable to an ordinary BH laser device. Moreover, it is not limited to the GaAlAs system laser device, but it is applicable to the InGaAsP system or InGaAlP system laser devices. The crystal growth technique is not limited to liquid phase epitaxy, but it is applicable to metal-organic chemical vapor deposition, vapor phase epitaxy, molecular beam epitaxy, etc.

EXAMPLE 9

In general, in the production of a BH laser device, the side walls of the mesa are exposed to the atmosphere until burying layers are buried on both sides of the mesa after the mesa is formed, resulting in a thin oxide film on the side walls of the mesa (i.e., on the surface of the GaAlAs crystal). Accordingly, when the burying layers are buried on both sides of the mesa on which such an oxide film has been formed, although it appears that the burying layers are completely buried on both sides of the mesa, crystal lattices at the interface between each side wall of the mesa and each burying layer are incompletely joined to each other, resulting in a junction with lattice distortion at the interface. Especially, the non-radiative recombination center, which is formed at the end faces of the active layer on the side walls of the mesa, causes deterioration of the laser device.

This example provides a method for the production of a BH-VSIS laser device which does not have a non-radiative recombination center which is liable to be formed at the end faces of the active layer on the side walls of the mesa.

The method of this example is characterized in that the end faces of the active layer on the side walls of the mesa undergo meltback just before the growth of burying layers. In general, when a $Ga_{1-x}Al_xAs$ crystal surface comes into contact with a Ga-unsaturation solution, meltback of the crystal surface becomes difficult with an increase in the Al composition ratio x of the $Ga_{1-x}Al_xAs$ crystal. Especially, when the value of x is 0.3 or more, meltback does not occur.

Figure 6A:
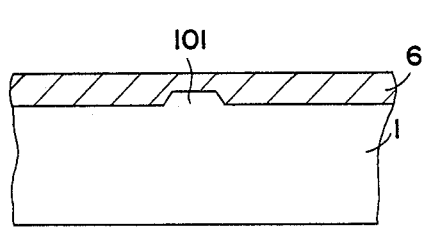
FIGS. 6(A) to 6(E) are diagrams showing processes of the production of another semiconductor laser device of this invention.

This example was completed using the above-mentioned phenomenon. A BH-VSIS semiconductor laser device of this example is provided as follows:

As shown in FIG. 6(A), on a p-GaAs substrate 1, a striped mesa 101 having a width of 5 μm and a height of about 0.5 μm is formed using an etchant ($H_2O:H_2O_2:H_2SO_4=50:2:1$). Then, an n-GaAs current blocking layer 6 is grown on the substrate 1 by liquid phase epitaxy in such a manner that the thickness of the portion of the current blocking layer 6 corresponding to the mesa 101 becomes about 0.6 μm. The surface of the current blocking layer 6 becomes flat.

Figure 6D:
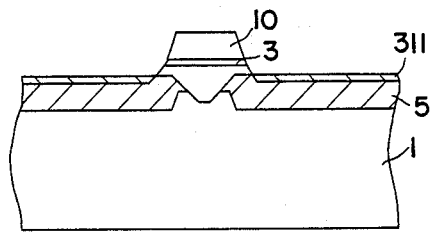
Figure 6B:
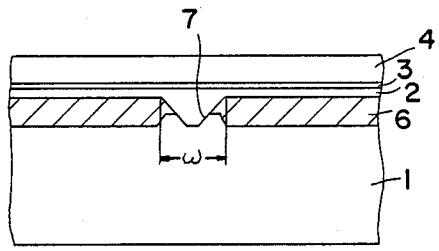

Then, as shown in FIG. 6(B), a V-striped channel 7 having a width w of 4.5-5 μm is formed in the p-GaAs substrate 1 through the n-GaAs current blocking layer 6. Then, on the current blocking layer 6 including the V-channel 7, a p-GaAlAs cladding layer 2, a GaAlAs active layer 3 and an n-GaAlAs cladding layer 4 are successively grown at 800° C. by liquid phase epitaxy, resulting in a double-heterostructure multi-layered crystal. The Al composition ratios of the cladding layers and the active layer are 0.4 and 0.05, respectively.

Figure 6E:
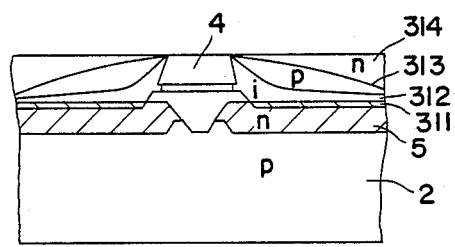
Figure 6C:
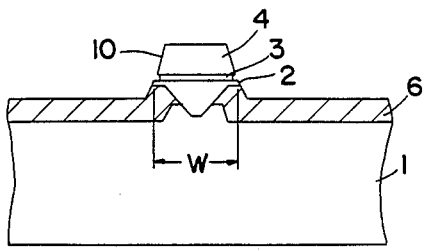
Figure 7:
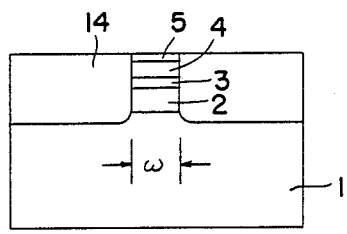
FIG. 7 is a cross-sectional view showing a conventional BH semiconductor laser device.
Figure 8:
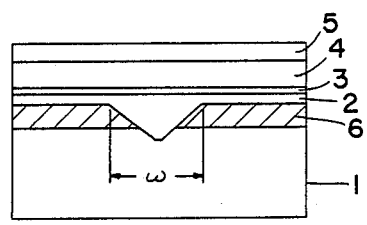
FIG. 8 is a cross-sectional view showing a conventional VSIS semiconductor laser device.
Figure 9:
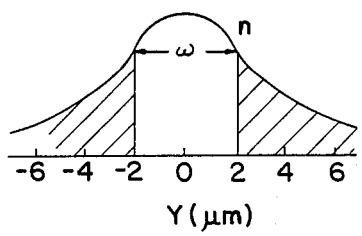
FIG. 9 is a graph showing the carrier density distribution of a conventional VSIS semiconductor laser device.
Figure 10:
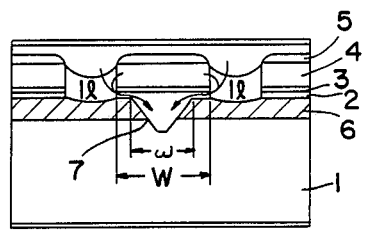
FIG. 10 is a cross-sectional view showing a conventional BH-VSIS semiconductor laser device.

Then, as shown in FIG. 6(C), grooves are formed by an etching technique using the above-mentioned etchant from the n-GaAlAs cladding layer 4 to the n-GaAs current blocking layer 6, resulting in a striped mesa 10. The thickness of the multi-layered crystal is not uniform over the whole area thereof, and accordingly, the depth of the grooves is also not uniform over the whole area thereof. Therefore, there is the possibility that the thickness of the etched portion of the current blocking layer 6 becomes excessively thin. In order to eliminate the problem, the current blocking layer 6 is, in advance, formed with a sufficiently great thickness. For this purpose, the above-mentioned mesa 101 is formed on the substrate 1 before the current blocking layer is grown on the substrate 1.

The width W of the active layer 3 within the mesa 10 is set to be wider than the width w of the V-channel 7 by 0.1-1 μm. In this example, W=5-6 μm.

Then, as the first step of a growth process of the burying layers, as shown in FIG. 6(D), an undoped $Ga_{1-z}Al_zAs$ first burying layer (z=0.8) 311 is grown on the current blocking layer 6 by a first Ga solution. The degree of supersaturation of the Ga solution is set to be 3° C. or less, and accordingly, the growth of the GaAlAs layer 311 does not reach the side walls of the mesa 10, so that the end faces of the active layer 3 cannot be covered by the GaAlAs layer 311.

Then, when the wafer is brought into contact with a second Ga solution containing an unsaturated As, only the end faces of the active layer 3 having a relatively low Al composition ratio undergo meltback, but other areas never undergo meltback because the areas other than the active layer 3 are made of GaAlAs layers having an Al composition ratio of 0.4 or more. As a result, the oxide film that has been on the end faces of the active layer 3 is removed. Thereafter, as shown in FIG. 6(E), an undoped $Ga_{1-z}Al_zAs$ second burying layer (z=0.8) 312 is grown by liquid phase epitaxy using a third Ga solution. The above-mentioned first and second burying layers 311 and 312 function as highly resistive layers (i.e., i-layers). Then, a Ge-doped p-GaAs third burying layer 313 is grown using the third Ga solution and a Te-doped n-GaAs fourth burying layer 314 is grown using a fourth Ga solution. These burying layers 313 and 314 are not grown over the surface of the n-GaAlAs cladding layer 4.

Then, the back face of the substrate 1 is subjected to an etching treatment to adjust the thickness of the wafer to about 100 μm. The upper face of the grown crystal and the back face of the substrate 1 are subjected to a vapor deposition treatment with metal materials of Au-Ge-Ni and Au-Zn, respectively, and subjected to a heating treatment to form an n-sided electrode of an alloy of Au-Ge-Ni and a p-sided electrode of an alloy of Au-Zn, respectively, followed by cleaving and scribing to form a laser device unit having an internal cavity length of 250 μm and a width of 300 μm.

Then, the facets are coated with an $Al_2O_3$ film having a thickness of $\lambda/2$ (wherein $\lambda$ is the wavelength). The unit is then mounted on a copper plate by means of a soldering material such as In in such a manner that the face of the n-sided electrode faces the copper plate, resulting in a BH-VSIS semiconductor laser device.

In the BH-VSIS laser device, the i-layer (i.e., the highly resistive layer) of the burying area constituting a pnipn-junction functions to block current. That is, when the laser device is forwardly biased, the nip-junction functions as a reverse bias and the breakdown voltage becomes high due to the said i-layer. This phenomenon can be observed by the following experiment: The mesa was removed from the laser device and the breakdown voltage of the burying area was measured. The voltage was as high as 9 volts. Leakage current which flows from the side walls of the mesa to the burying area was also observed to be little due to the highly resistive layer.

The oscillation wavelength of the above-mentioned BH-VSIS laser device was 830 nm and the threshold current thereof was about 20 mA, which corresponds to a threshold current density of 1.3 KA/cm². Moreover, an aging test for this BH-VSIS laser device, which was carried out at 50° C. with 5 mW output power, indicated that an increase in the driving current was not observed for 1500 hours or more. This long life characteristic of the BH-VSIS laser device results from the feature of the process of this example that the end faces of the active layer on the side walls of the mesa are buried by the burying layer after they undergo meltback.

The semiconductor laser device of this example is not limited to the above-mentioned BH-VSIS laser device, but it is, of course, applicable to an ordinary BH laser device. Moreover, it is not limited to the GaAlAs system laser device, but it is applicable to InGaAsP system or InGaAlP system laser devices. The crystal growth technique is not limited to liquid phase epitaxy, but it is applicable to metal-organic chemical vapor deposition, vapor phase epitaxy, molecular beam epitaxy, etc.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. In a semiconductor laser device with a stripe-channeled substrate, an active layer for laser oscillation, and first and second cladding layers sandwiching said active layer therebetween on the substrate, said laser device comprising:
   an optical waveguide that is formed within the active layer based on a decrease in the effective refractive index due to the striped channel of the substrate, the outside of said channel absorbing a laser beam produced in the active layer;
   a striped mesa that is formed by the removal of the portions corresponding to the outside of said optical waveguide; and
   a multi-layered crystal that is grown into said removed portions, said multi-layered crystal including a plurality of burying layers and containing a pin-, pp$^-$n-, or pn$^-$n- reverse bias junction.

2. A semiconductor laser device according to claim 1, wherein said multi-layered crystal is composed of a current blocking layer disposed on the substrate and a plurality of burying layers disposed on said current blocking layer.

3. A semiconductor laser device according to claim 1, wherein said multi-layered crystal is composed of a plurality of burying layers disposed on the substrate.

4. A semiconductor laser device according to claim 1, wherein the burying layer that comes into contact with the active layer on the side walls of said striped mesa has a high resistance of 0.1 Ω·cm or more.

5. A semiconductor laser device according to claim 1, wherein all of the burying layers have a high resistance of 0.1 Ω·cm or more and constitute a pin-, pp$^-$n- or pn$^-$n- reverse bias junction.

6. A semiconductor laser device according to claim 4, wherein an undoped or Ge doped $Ga_{1-z}Al_zAs$ layer having an Al composition ratio z of 0.5–1 is used as said burying layer that comes into contact with the active layer on the side walls of said striped mesa.

7. A semiconductor laser device according to claim 1, wherein the width of the active layer within the striped mesa is uniform from one facet to the other facet of said laser device.

8. A semiconductor laser device according to claim 1, wherein the width of the active layer within the striped mesa is greater than that of the striped channel in the vicinity of the facets of said laser device and is nearly equal to that of the striped channel inside of both facets of said laser device.

* * * * *